United States Patent [19]
Barnett

[11] 3,931,577
[45] Jan. 6, 1976

[54] RADIO RECEIVER PROTECTION ARRANGEMENT
[75] Inventor: Robert Leigh Barnett, Carlingford, Australia
[73] Assignee: Amalgamated Wireless (Australia) Limited, Sydney, Australia
[22] Filed: July 2, 1974
[21] Appl. No.: 485,285

[52] U.S. Cl. .............................. 325/362; 325/376
[51] Int. Cl.² ........................................ H04B 1/18
[58] Field of Search .......... 178/7.3 R; 325/362, 380, 325/376, 387; 317/53; 328/8–10; 330/51; 331/62

[56] References Cited
UNITED STATES PATENTS

| | | | |
|---|---|---|---|
| 2,062,691 | 12/1936 | Willging | 325/362 |
| 2,097,272 | 10/1937 | Drake | 325/362 |
| 2,767,309 | 10/1956 | Schaner | 325/362 |
| 3,372,336 | 3/1968 | Bachman et al. | 325/362 |
| 3,587,017 | 6/1971 | Kurusu | 325/362 |

FOREIGN PATENTS OR APPLICATIONS

| | | | |
|---|---|---|---|
| 877,040 | 9/1961 | United Kingdom | 325/362 |

Primary Examiner—Albert J. Mayer
Assistant Examiner—Jin F. Ng
Attorney, Agent, or Firm—Weingarten, Maxham & Schurgin

[57] ABSTRACT

A receiver protection arrangement in which a voltage dependent on aerial voltage and a voltage dependent on aerial current are aggregated and applied to means responsive to a predetermined aggregate level to effectively short circuit the aerial lead. Additional means may be provided to dissipate energy in the input stage of a protected receiver to cause a reduced impedance to be reflected across the output of the protective arrangement.

5 Claims, 3 Drawing Figures

RADIO RECEIVER PROTECTION ARRANGEMENT

BACKGROUND OF THE INVENTION

This invention is directed to a radio receiver protection arrangement which is capable of protecting the receiver from RF overloads at the aerial terminal, such as may be experienced, for example, when receivers are operated in close proximity to transmitters.

The problem of protecting receivers from damagingly-high inputs from nearby transmitters is not a new one, and the situation worsened with the introduction of receivers employing transistors as the active elements. It is known that damage can be caused to a receiver whether the receiver is operating or not, so that a successful protection arrangement must function satisfactorily in either case.

The Applicant is aware of several earlier attempts to provide the kind of protection required, but all the earlier arrangements of which he is aware are in his opinion unsatisfactory to some degree and do not afford the complete and certain protection required today.

One object of this invention is to provide a radio receiver protection arrangement which provides swift and sure protection for a receiver in all situations. A further object of this invention is to provide a radio receiver protection arrangement of improved performance which is completely passive in the sense that no power supply is required, all the energy required to operate the arrangement being derived from a potentially damaging voltage and/or current overload at the input of the protected receiver.

SUMMARY OF THE INVENTION

A receiver protection arrangement in accordance with this invention comprises a peak rectifier arrangement detecting an aerial voltage on an aerial lead and providing a unidirectional voltage the magnitude of which is dependent on the magnitude of the aerial voltage, a transformer-rectifier arrangement detecting an aerial current on the aerial lead and providing a unidirectional voltage the magnitude of which is dependent on the magnitude of the aerial current, means aggregating the two unidirectional voltages and means responsive to a predetermined aggregate level to close an electronic switch and so effectively place a short circuit on the aerial lead.

DESCRIPTION OF PREFERRED EMBODIMENTS

Figure 1:
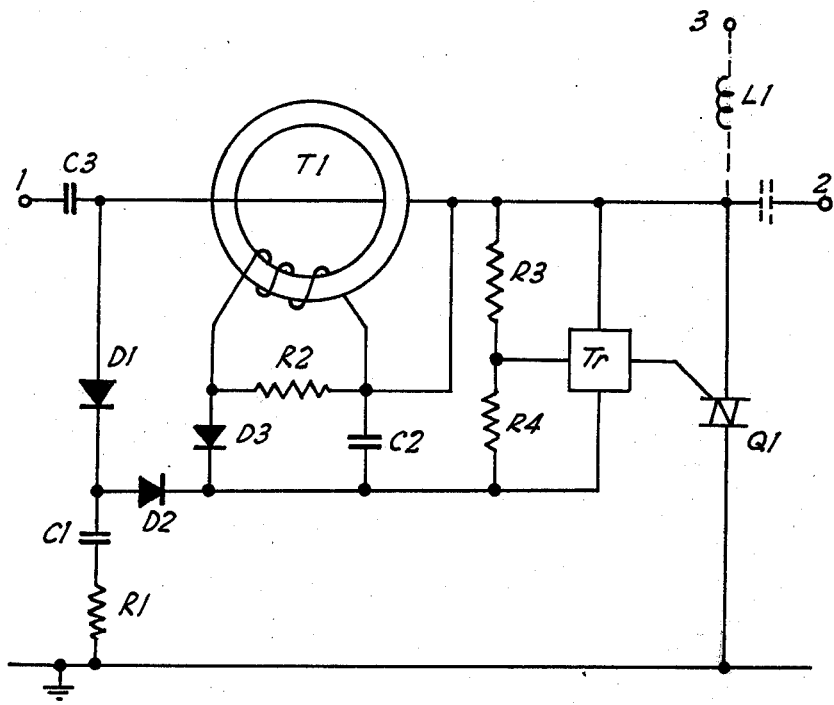
FIG. 1 of the accompanying drawings shows a protection circuit according to an embodiment of the invention.

The protection system, which is shown in basic form in FIG. 1 of the accompanying drawings, comprises aerial voltage and current detectors, a trigger circuit, and a triac shunt switch. The triac may of course be replaced with another device or group of devices exhibiting similar operating characteristics. The object of the arrangement is to short circuit the receiver input when large overload signals appear at that input.

The arrangement shown in FIG. 1 is intended to be interposed between an aerial connected to terminal 1 and a receiver, connected to terminal 2.

The voltage detector in this example comprises the diodes D1, D2, the capacitors C1, C2 and resistor R1. Diodes D1, D2 function as a peak detector to rectify the aerial voltage and charge capacitor C2. The current detector in this example comprises the diode D3, capacitor C2, resistor R2 and current transformer T1. Transformer T1 produces a voltage across resistor R2 by current flowing in its secondary winding, when a current is present in the primary winding. This voltage is rectified by diode D3 to charge capacitor C2. It is seen therefore that the charge on capacitor C2 is dependent on the aerial voltage and/or the aerial current.

The voltage across capacitor C2 is used to actuate a trigger circuit Tr when the voltage reaches a predetermined level. In this example a potential divider consisting of resistors R3, R4 is interposed between the capacitor and the trigger circuit. Activation of the trigger circuit in turn fires a triac Q1 into conduction, effectively placing a short circuit between the aerial lead and ground, that is, across the receiver input.

A capacitor C3 is optionally provided for DC isolation at the terminal 1 input, and a capacitor may similarly be used at the output terminal 2. It is noted that the power required to operate the protective circuit as described so far is derived from the overload signal input. The circuit will maintain the effective short circuit through the triac Q1 as long as the overload persists, and will reset to the normal condition immediately the overload is removed. It will be seen that an overload consists of either an aerial voltage or an aerial current exceeding a predetermined amount or an aggregation of both which exceeds a predetermined amount.

In an alternative arrangement to that shown in FIG. 1, the non-earthy anode of the triac Q1 is connected to the aerial lead on the input side rather than the output side of transformer T1. This prevents large overload currents flowing through the transformer primary, and also provides protection for the trigger circuit by limiting the output from the transformer secondary, that is, the DC voltage produced by diode D3.

In the "off" condition the capacitance of the triac is in shunt with the receiver input. At operating frequencies where this becomes significant, a bias voltage can be applied to the triac, represented by terminal 3 and choke L1 in FIG. 1, to reduce the off capacitance. Alternatively the capacitance may be combined with the inductance of the output lead connected to terminal 2 to form a low-pass filter. Adjustment of bias voltage may be employed to "trim" the capacitance of the triac, for example, to compensate for variations in lead inductance.

Figure 2:
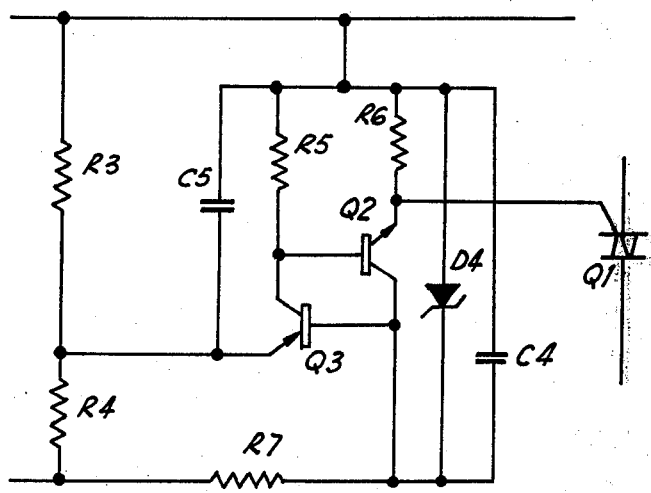
FIG. 2 shows an example of a trigger circuit for use in the arrangement of FIG. 1.

One example of a trigger circuit Tr is shown in greater detail in FIG. 2. Transistors Q2, Q3, together with resistors R3 and R6 form a programmable unijunction switch. The zener diode D4 and resistor R7 limit the voltage across transistor Q2 and the charge on capacitor C4. Capacitor C5 functions as a filter at the output of the potential divider formed by resistors R3 and R4.

At a predetermined level of overload, the unijunction switch is activated and triggers the triac Q1 into conduction as capacitor C4 discharges through resistor R6. In the alternative connection of the triac Q1 to the input side of the current transformer T1, it may be desirable to provide filtering means in the gate lead of the triac to prevent the RF voltage developed across the primary impedance of the transformer firing the triac.

The protection arrangement as described so far operates at a speed which is dependent on the size of the overload, a larger overload producing a faster response time. Circumstances can be envisaged where the speed of response or the level at which response occurs is too slow or too low respectively to afford full protection under all circumstances.

In a situation of the kind described and in accordance with a further development of this invention, means are provided in the receiver which not only provides fast initial protection for the input stage of the receiver, but also accelerate the operation of the protective arrangement as described so far. This further development of the invention comprises means responsive to the presence of a signal in excess of a predetermined amplitude in the input stage of a protected radio receiver to limit signal peaks and dissipate the energy therein, said means being so arranged that the dissipation of energy causes a substantially reduced impedance to be reflected across the output of the earlier-described protective arrangement. One example of this further development will now be described.

Figure 3:
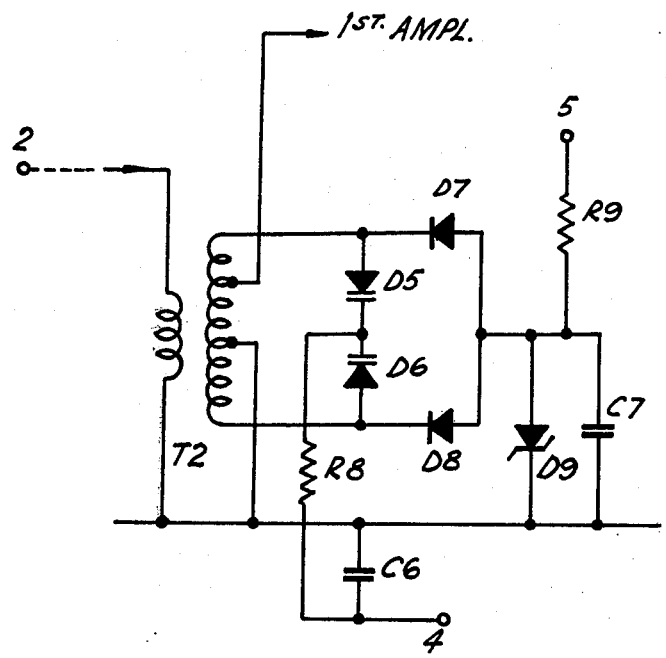
FIG. 3 shows a further protection circuit for use in conjunction with the arrangement of FIG. 1.

FIG. 3 shows a typical input circuit of a radio receiver employing varactor diode tuning and transistor amplifying devices, ignoring the obvious band-switching arrangements. The input RF signal is applied to the primary of the first selector filter transformer T2, the secondary of which is tuned by varactor diodes D5, D6. The tuning voltage for these diodes is applied in the usual way from a terminal 4 through a filter consisting of resistor R8 and capacitor C6. The input to the first amplifier is tapped onto the transformer secondary, the centre tap of which is grounded.

The protection means in this example consists of two further diodes D7, D8, a zener diode D9 and means for biassing the zener diode including a resistor R9, a capacitor C7 and a bias source represented by terminal 5. The zener diode voltage limits the peak RF voltage that can appear across the secondary of transformer T2, because when the RF voltage exceeds the zener voltage, the diodes D7 and D8 will conduct, thus limiting the peak secondary voltage to a safe value. The tapping point for the first amplifier stage on the secondary of transformer T2 can be chosen, inter alia, so that with the now-limited voltage across the secondary, the level applied to the first amplifier will lie within permissible limits.

The passage of peak currents in the diodes D7, D8 causes a considerable reduction in the input impedance of the circuit, that is, the impedance which is connected to terminal 2 in FIG. 1. By allowing a greater current to flow through the arrangement of FIG. 1, its operation is accelerated. It will be clear that the operation of the additional fast initial protection and the main protection described earlier can be organised by those skilled in the art into one smoothly-operating and highly effective protection arrangement. It will also be clear that, with particular reference to the receiver input circuit used as an example in FIG. 3, the organisation of this method of overload protection in other configurations of input circuit will be obvious to those skilled in the art. For example, for a protection arrangement which was required to be independent of the receiver the transformer T2 of FIG. 3 could be made aperiodic, followed by a normal input to the receiver. Alternatively again, a plurality of such aperiodic transformers could be provided, remotely selected from the receiver band selection arrangement. Thus whilst in the example described here the protection arrangement encompasses part of the protected receiver, this is not always the case.

What is claimed is:

1. A radio receiver protection arrangement comprising:
    an aerial input terminal;
    an output terminal adapted to be coupled to the input of a radio receiver;
    an aerial lead connected between said input and output terminals;
    rectifier means connected to said aerial lead for providing a first unidirectional signal representative of peak voltage on said aerial lead;
    rectifier means coupled to said aerial lead for providing a second unidirectional signal representative of current through said aerial lead;
    means for combining said first and second signals to form a third signal representative of the aggregate levels of said first and second signals;
    an electronic switch connected between said aerial lead and ground; and
    means responsive to said third signal for closing said electronic switch to shunt said input signal therethrough at a predetermined level of said third signal.

2. The radio receiver protection arrangement recited in claim 1 wherein:
    said rectifier means for providing a first signal comprises a solid state peak rectifier;
    said rectifier means for providing said second signal comprises:
        a transformer employing a portion of said aerial lead as its primary;
        a resistor connected across the secondary of said transformer; and
        a second solid state rectifier in series with said resistor;
    said means for combining said first and second signals comprises a capacitor connected to the output of said peak rectifier, said second rectifier and said resistor being connected across said capacitor.

3. The radio receiver protection arrangement recited in claim 1 wherein:
    said means for closing said electronic switch comprises a trigger circuit coupled between said means for forming a third signal and said electronic switch.

4. The radio receiver protection arrangement recited in claim 1 wherein a selector filter transformer of said radio receiver is coupled to said output terminal, said protection arrangement further comprising:
    means coupled across the secondary of said selector filter transformer for limiting the peak RF voltage across said secondary when the peak RF voltage exceeds a predetermined safe value, said limiting means comprising: a zener diode, means for biasing said zener diode to a predetermined level and diode means coupled between said diode means and ground;
    whereby current through said rectifier means for providing a second signal is increased causing said means for closing said electronic switch to operate to thereby close said electronic switch.

5. The radio receiver protection arrangement recited in claim 4 wherein said diode means comprises a pair of diodes, said zener diode being coupled between a point common to said pair of diodes and ground.

* * * * *